(12) United States Patent
Stadler et al.

(10) Patent No.: US 11,984,881 B2
(45) Date of Patent: May 14, 2024

(54) THYRISTOR CIRCUIT AND THYRISTOR PROTECTION METHOD

(71) Applicant: ABB Schweiz AG, Baden (CH)

(72) Inventors: Raeto Stadler, Langnau am Albis (CH); Ralf Baechle, Weilheim (DE)

(73) Assignee: ABB Schweiz AG, Baden (CH)

( * ) Notice: Subject to any disclaimer, the term of this patent is extended or adjusted under 35 U.S.C. 154(b) by 294 days.

(21) Appl. No.: 17/610,363

(22) PCT Filed: May 8, 2020

(86) PCT No.: PCT/EP2020/062940
§ 371 (c)(1),
(2) Date: Nov. 10, 2021

(87) PCT Pub. No.: WO2020/229366
PCT Pub. Date: Nov. 19, 2020

(65) Prior Publication Data
US 2022/0224324 A1    Jul. 14, 2022

(30) Foreign Application Priority Data
May 10, 2019  (EP) .................................. 19173822

(51) Int. Cl.
*H03K 17/082* (2006.01)
*H03K 17/14* (2006.01)
*H03K 17/08* (2006.01)

(52) U.S. Cl.
CPC ......... *H03K 17/0824* (2013.01); *H03K 17/14* (2013.01); *H03K 2017/0806* (2013.01)

(58) Field of Classification Search
CPC .... H03K 17/08; H03K 17/0824; H03K 17/14; H03K 2017/0806
See application file for complete search history.

(56) References Cited

U.S. PATENT DOCUMENTS 3,611,043 A * 10/1971 Steen ..................... H02H 3/044
361/115
3,662,250 A    5/1972 Piccone
(Continued)

FOREIGN PATENT DOCUMENTS

| CN | 104488183 A | 4/2015 |
| CN | 107102246 A | 8/2017 |

(Continued)

OTHER PUBLICATIONS

Chinese Search Report for International App. No. PCT/EP2020/062940, dated Jul. 3, 2023, 3 pages.
(Continued)

*Primary Examiner* — Scott Bauer
(74) *Attorney, Agent, or Firm* — Armstrong Teasdale LLP

(57) ABSTRACT

A thyristor circuit includes at least one branch including at least one thyristor, a thyristor control circuit and a current detector. The current detector is configured to detect a current value representative of an electrical current flowing through the thyristor and to input the detected current value into the thyristor control circuit. The thyristor control circuit is configured to determine a fault condition in which the detected current value exceeds a predetermined current threshold based on a deteriorated blocking ability of the thyristor. Dependent on the determination result, the thyristor control circuit triggers the thyristor into a conductive state.

20 Claims, 2 Drawing Sheets

(56) References Cited

U.S. PATENT DOCUMENTS

| | | | | |
|---|---|---|---|---|
| 4,050,083 | A | * | 9/1977 | Jaskolski .......... H01L 29/66992 |
| | | | | 327/512 |
| 4,745,513 | A | | 5/1988 | McMurray |
| 4,935,863 | A | * | 6/1990 | Calvas ................ G05B 19/058 |
| | | | | 700/169 |
| 4,937,646 | A | * | 6/1990 | Tihanyi ................... H01L 23/34 |
| | | | | 327/512 |
| 5,170,310 | A | * | 12/1992 | Studtmann ............. H02H 3/083 |
| | | | | 361/65 |
| 6,091,087 | A | * | 7/2000 | Iwamuro ............. H01L 29/7455 |
| | | | | 257/133 |
| 2015/0309108 | A1 | | 10/2015 | Geske |

FOREIGN PATENT DOCUMENTS

| | | | | |
|---|---|---|---|---|
| CN | 206649310 | | 11/2017 | |
| DE | 3619740 | A1 * | 12/1987 | ......... H03K 17/0824 |
| DE | 202009014759 | U1 | 2/2010 | |
| EP | 0212854 | A1 | 2/2010 | |
| JP | H07123584 | A | 5/1995 | |

OTHER PUBLICATIONS

International Search Report and Written Opinion for International App. No. PCT/EP2020/062940, mailed Jul. 27, 2020, 13 pages.
European Search Report for corresponding European App. No. 19173822.8, mailed Nov. 11, 2019, 10 pages.

* cited by examiner

THYRISTOR CIRCUIT AND THYRISTOR PROTECTION METHOD

CROSS-REFERENCE TO RELATED APPLICATIONS

This application is the U.S. National Stage Application of International Patent Application No. PCT/EP2020/062940, filed May 8, 2020, which claims the benefit of priority to European Patent Application No. 19173822.8, filed May 10, 2019, each of which is hereby incorporated by reference herein.

TECHNICAL FIELD

The present disclosure relates to a thyristor circuit having at least one branch that includes at least thyristor, and to a thyristor protection method for protecting a thyristor in the at least one branch.

BACKGROUND

In high voltage, high current applications, electronic devices often employ thyristors as power electronic components. Upon reception of a trigger current at its gate, a thyristor starts to conduct an electrical current in a path from its anode terminal to its cathode terminal through its stack of semiconductor junctions. In the literature, triggering is also referred to as firing or gating. Unless triggered, the thyristor is in a non-conducting state or blocking state.

Thyristors are thus used for current control in various applications, e. g. as crow bars, high power rectifiers etc. When thyristors or a stack of multiple series-connected thyristors are connected in an antiparallel manner, they can be used to control currents in both directions, e. g. in AC applications such as AC furnaces.

In typical applications, a fault current condition may occur. In this case the thyristors involved in conducting the fault current are conventionally blocked. As a temperature of the junctions, or junction temperature, rises to a high value, the blocking ability of a thyristor starts to deteriorate, leading to a high resistance electrical path through the junctions. Thus, in the blocking state and in the case of a fault current condition, the rise of the junction temperature may further be promoted, which may lead to a failure or thermal destruction of the thyristor.

There is a desire to protect the thyristor or thyristors in a thyristor circuit from being thermally destroyed in a fault current condition.

Document U.S. Pat. No. 3,611,043 A describes a protective circuit for a power system including a thyristor switch and a backup breaker provided in series with the thyristor switch. The protective circuit causes the backup circuit breaker to interrupt in the abnormal event that the thyristor switch becomes disabled.

BRIEF DESCRIPTION

The present disclosure provides a thyristor circuit having an improved fault current behavior. Example embodiments are evident from the dependent claims and the following description.

According to an aspect relating to a thyristor circuit, a thyristor circuit includes at least one branch, the branch including at least one thyristor. The thyristor circuit further includes a thyristor control circuit and a current detector. The thyristor control circuit is for selectively triggering the thyristor. The current detector is configured to detect a current value representative of an electrical current that flows through the thyristor. The current detector is further configured to input the detected current value into the thyristor control circuit. The thyristor control circuit is configured to determine a fault condition in which the detected current value exceeds a predetermined current threshold based on a deteriorated blocking ability of the thyristor. The thyristor control circuit is further configured to trigger the thyristor into a conductive state dependent on the result of the determination.

Fault condition, as used herein, typically refers to an event or time period during which certain electrical values of the thyristor or the branch in which the thyristor is located exceed a limit value. The limit value may be representative of certain In some aspects, the fault condition may be an excessive current, or overcurrent, occurring in one or more branches. For example, the fault condition may be a branch fault, e.g. an excessively high current in one branch. In other examples, the fault condition may be a multi-branch fault, e.g. an excessively high current in multiple branches.

Excessively high current, as used herein, typically refers to a magnitude or amplitude of a current that will lead to a destruction of the thyristor within a short time period, such as a time period shorter than 500 ms or shorter than 100 ms or shorter than 10 ms.

According to an aspect relating to a thyristor protection method, a thyristor protection method for protecting a thyristor in at least one branch of a thyristor circuit includes detecting a current value representative of an electrical current flowing through the thyristor, determining whether the current value exceeds a predetermined current threshold based on a deteriorated blocking ability of the thyristor, and dependent on the determination result, triggering the thyristor into a conductive state.

In the above aspects relating to the thyristor circuit or to the thyristor protection method, when the thyristor control circuit determines that a fault condition has occurred, it issues a trigger current to the gate of the at least one thyristor such that the thyristor is brought into the conductive state. A fault condition is detected as an overcurrent condition, not as an overvoltage condition. The fault condition includes a high current condition, or overcurrent condition, typically based on a fault external to the device that includes the thyristor circuit, e. g. a converter external fault.

When the thyristor control circuit determines that a fault condition has not occurred, it may perform a normal operation of the thyristor, i. e. perform a selective trigger operation of the thyristor according to a normal operation application scheme. Such a normal operation application scheme may as well be performed by another device different from the thyristor control circuit. As non-limiting and illustrative examples, the respective device may e. g. trigger the thyristor according to crow bar scheme in a crow bar application, e. g. trigger the thyristor according to a rectification scheme in a rectification application, or e. g. trigger the thyristor according to a current and/or power control scheme of an AC arc furnace.

The current detector may be any suitable type of current detection device, and as a non-limiting example may be an inductively coupled current detector. The current threshold may be predetermined and set in advance, i. e. prior to operation. The current threshold may, for example, be set taking into account a nominal operation range or an extended operation range of the thyristor. A nominal operation range, as used herein, includes at least a current that the thyristor is able to bear permanently, e. g. by design, without being deteriorated or destroyed beyond the design limits. An extended operation range, as used herein, includes at least a current that the thyristor is able to bear for a limited period of time. For example, the current threshold may be set to just above the maximum nominal operation current of the thyristor, or it may be set to e. g. 105%, 110% or 115% of the nominal operation current. In a further example, the current threshold may be set to just above the extended operation range.

The conductive state that is to be achieved by triggering the thyristor, as used herein, is typically a state in which a conducting current valve behavior is intended. In the conductive state, an electrical resistance across the junctions of the thyristor is typically significantly lower than during the flow of an unintended current that flows in decreased blocking conditions, e. g. in a high-temperature state of the junctions.

By intentionally triggering the at least one thyristor into the conductive state when a fault condition is detected, a deterioration of the blocking capabilities can be suppressed, and thus a harmful increase of the junction temperature due to a fault current through the at least one thyristor can be prevented.

According to an embodiment, triggering the thyristor into the conductive state includes continuously triggering the thyristor into the conductive state. The configuration may thus be such as to continuously trigger the thyristor into the conductive state dependent on the determination result. Continuously triggering, as used herein, means that the conductive state of the thyristor is maintained by the triggering operation without allowing the thyristor to revert to the blocked state, at least as long as the fault condition is determined to prevail.

In embodiments, continuously triggering the thyristor into the conductive state may include continuously triggering the thyristor for at least 50 ms, for at least 100 ms, for at least 130 ms, for at least 160 ms.

In further embodiments, the thyristor circuit further includes a circuit breaker, e.g. for the branch current. Here, when continuously triggering the thyristor, the control of the circuit breaker is carried out such as to interrupt the current, such as the branch current. As used herein, the term branch current may refer to all branch currents in the case that multiple branches are provided.

A circuit breaker operation involves a certain delay, or time-lag, that mainly results from actors of the breaker that perform mechanical actions to interrupt a line carrying the branch current. In an embodiment involving the circuit breaker, the herein-described control by the thyristor control circuit may efficiently bridge the time gap from a fault condition occurrence until a secure interruption by the circuit breaker.

In embodiments, continuously triggering the thyristor into the conductive state may include continuously triggering the thyristor for at least as long as it takes for the circuit breaker to interrupt the line carrying the branch current.

In further embodiments, the thyristor circuit includes a plurality of branches, for example but not limited to three branches in a three-phase system. Each branch includes at least one thyristor.

According to embodiments, the thyristors in each branch are controlled in a like manner, for example by the thyristor control circuit. For example, the thyristors in each of the branches are triggered into the conductive state dependent on the determination result, as described herein.

In embodiments employing the plurality of branches, a circuit breaker, as described herein, may be configured to interrupt the currents in each of the branches, e. g. a common circuit breaker for all branches. For example, the circuit breaker is controlled such as to interrupt the branch currents in all branches when continuously triggering the thyristor or thyristors.

According to further embodiments, the fault condition is determined when at least in one of the multiple branches the detected current value exceeds the predetermined current threshold. For example, and not by way of limitation, when only in one or two of three branches of a three-phase system the respective detected current value exceeds the predetermined current threshold, the fault condition is determined, and the thyristor or the thyristors, the thyristors of all branches, is/are triggered into the conductive state. According to yet further embodiments, the thyristor control circuit is configured to trigger the at least one thyristor of each branch into the conductive state dependent on the fault condition.

According to further embodiments, the at least one branch includes a stack of thyristors. A stack of thyristors includes two or more thyristors. In an aspect, the number of thyristors in the stack is selected depending on a voltage level to which the stack is connected or which the stack is exposed to. The voltage level is, for example, a rated voltage level or a maximally expected voltage level.

In an example configuration, the stack of thyristors includes 10 thyristors or more, 20 thyristors or more, including 24 thyristors. The stack is typically configured of a configuration a first series connection of thyristors and a second series connection of thyristors. The first and second series connections are disposed in an antiparallel connection, i. e. for carrying currents in one branch direction and for carrying currents in a branch direction opposite to the one branch direction, respectively.

In embodiments employing a stack of thyristors, the thyristor control circuit is configured to trigger all thyristors of the stack in a respective branch into the conductive state dependent on the fault condition.

In further embodiments employing a stack of thyristors, where a stack of thyristors is disposed in multiple branches, the thyristor control circuit is configured to trigger all thyristors of each stack in all branches into the conductive state dependent on the fault condition.

According to an aspect, the thyristor circuit may further include a network interface for connecting at least one of the thyristor control circuit and the current detector to a data network, in particular a global data network. The data network may be a TCP/IP network such as Internet. The thyristor control circuit and/or the current detector is operatively connected to the network interface for carrying out commands received from the data network. The commands may include a control command for controlling the thyristor control circuit, e. g. a setting command for setting the current threshold, or a circuit breaker operation command. In this case, the thyristor control circuit is adapted for carrying out the task in response to the control command. The commands may include a status request. In response to the status request, or without prior status request, the thyristor control circuit and/or the current detector may be adapted for sending a status information to the network interface, and the network interface is then adapted for sending the status information over the network. The commands may include an update command including update data. In this case, the thyristor control circuit and/or the current sensor is adapted for initiating an update in response to the update command and using the update data. According to an embodiment, the network interface is configured to transceive a digital signal between the thyristor control circuit and/or the current detector on the one hand, and the data network on the other hand. The digital signal includes an operational command, typically a setting value for the current threshold, and/or information about the thyristor control circuit and/or the current detector or the network.

BRIEF DESCRIPTION OF THE DRAWINGS

The subject-matter of the present disclosure will be explained in more detail with reference to example embodiments which are illustrated in the drawings. In the drawings.

Throughout the drawings, identical or like parts are provided with the same reference symbols, and the description thereof will not be repeated.

DETAILED DESCRIPTION

Figure 1:
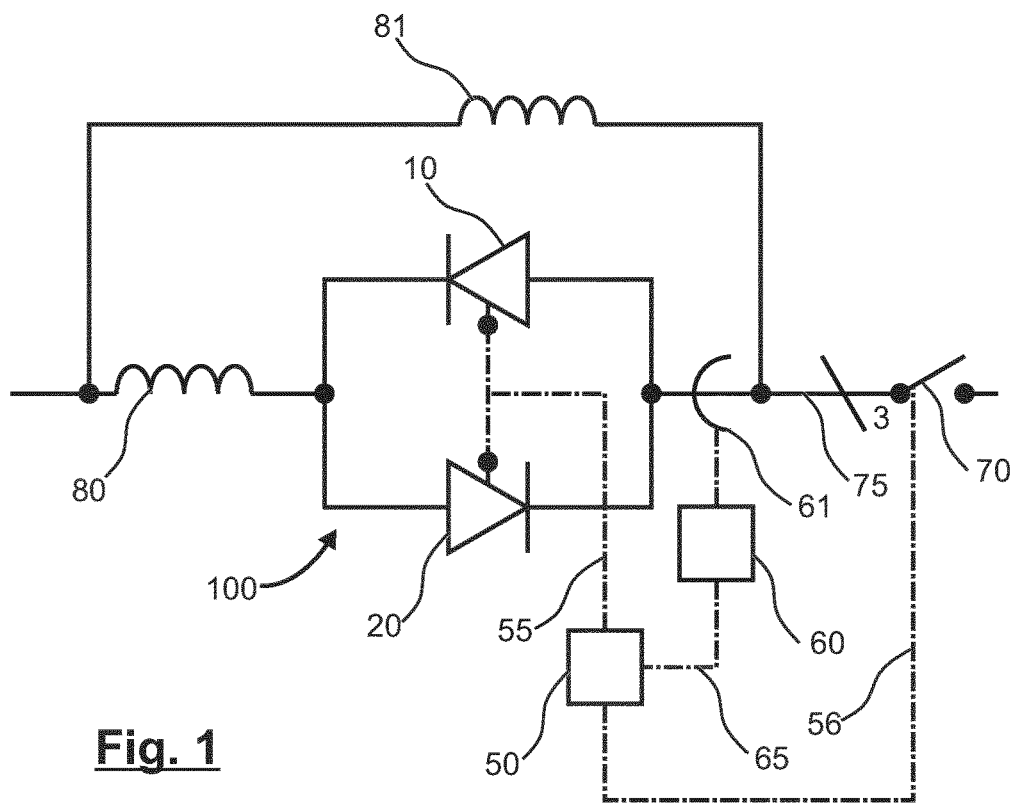
FIG. 1 schematically shows a thyristor circuit according to an embodiment.

FIG. 1 shows a thyristor circuit 100 having a branch including a series circuit, the series circuit configured of a snubber reactor 80 and a pair of antiparallel-connected thyristors 10, 20. A parallel reactor 81 is connected in an electrically parallel manner to the series circuit. In FIG. 1, upstream of a feed line 75, the digit "3" indicates a three-phase system in which the thyristor circuit 100 is provided in each of the three branches. However, the present disclosure is not limited to a three-phase system, and 1, 2, or 4 or more branches may as well be provided. A three-phase circuit breaker 70 is provided to electrically interrupt the feed line 75 upon reception of a circuit breaker interruption signal.

A thyristor control circuit 50 is configured such that it may selectively trigger the thyristors 10, 20. Selectively triggering, as used herein, may include the thyristor control circuit 50 controlling each thyristor 10, 20 independently from each other. Selectively triggering, as used herein, may also include the thyristor control circuit 50 controlling multiple thyristors 10, 20, e. g. a common group of thyristors 10, 20 or a stack of thyristors 10, 20 (to be described later) together. The thyristor control circuit 50 may be connected with a gate of the respective thyristor 10, 20 via a gate trigger line 55. In the configuration shown in FIG. 1, the thyristor control circuit 50 is also connected, via a circuit breaker trigger line 56, with the three-phase circuit breaker 70 to control the circuit breaker to interrupt the phases of feed line 75.

A current sensor assembly, including an inductive current sensor 61 and a current value output circuit 60 coupled thereto, is connected via a current signal line 65 with the thyristor control circuit 50. The current sensor 61 detects a current flowing in the branch that contains the thyristors 10, 20. The current value output circuit 60 calculates a current value from the output of the current sensor 61 and inputs the current value, as a current signal, into the thyristor control circuit 50.

In the thyristor control circuit 50, a value of a current threshold is set in advance. The thyristor control circuit 50 determines whether the current in the branch, as input via the current signal line 65 as the current signal, exceeds the current threshold. Exceeding, as used herein, includes exceeding an absolute value of the current, i. e. exceeding is fulfilled when a positive-sign current becomes greater than a maximum value or when a negative-sign current becomes less than a minimum value. In typical embodiments, the maximum value is the reverse-sign representation of the minimum value, i. e. the absolute value of the current is taken into account.

The current threshold is typically chosen such as to represent a branch fault, such as a low resistance current or short-circuit current; in other words: The current threshold typically represents an overcurrent condition which may lead to a destruction, such as a thermal destruction, of the thyristor.

The current threshold in the present embodiment is predetermined and set in advance, i. e. prior to operation. Here, the current threshold is set taking into account the nominal operation range the thyristor, i. e. in the present case a maximum current. The maximum current may be determined depending on a blocking ability that is shifted, i.e. deteriorated, when the junction temperature rises due to the current flowing through the thyristor. The maximum current may also be determined to be a current that the thyristor is able to bear permanently without being destroyed.

When the thyristor control circuit 50 determines that the fault condition is present, it issues a gate trigger signal to the gates of the thyristors 10, 20 via the gate trigger line 55. A gate trigger signal, as used herein, is a signal that ensures an ignited state or pass-through state of the thyristor from its anode to its cathode, e. g. via a sufficient gate current flowing into the gate. The gate trigger signal is typically a pulsed signal, or pulse train, having a pulse width of at least 50 ms, of at least 100 ms, or at least 130 ms, or at least 160 ms.

Together with issuing the gate trigger signal, e. g. at the same time as issuing the gate trigger signal, the thyristor control circuit 50 issues a circuit breaker trigger signal via the circuit breaker trigger line 56. The circuit breaker trigger signal instructs the circuit breaker to be operated into its interrupted position, i. e. line-open position.

In a conventional application, when a high current that fulfils the condition for a fault flows through the branch that includes the thyristors 10, 20, any thyristor 10, 20 that is still operated to be in the blocked state (i. e., the non-ignited state) may deteriorate in blocking ability due to a rise of temperature that is caused by the high current. As a result, the temperature of the pn junctions in the thyristor 10, 20 rises further. Even if a circuit breaker, such as circuit breaker 70, is operated upon detection of a fault condition, it takes several tens to several hundreds of milliseconds for the circuit breaker to operate. Blocking in case of a high junction temperature in the thyristor during this time period, or time gap, may be sufficient to permanently deteriorate or destroy the thyristor.

In contrast, according to the present disclosure, the thyristor 10, 20 is operated to be in the conductive state when a fault condition is detected. While the fault current, i.e. excessively high current, flows through the thyristor 10, 20, the pn junctions do not block, thus suppressing the temperature rise during the above-stated time period to a lower value.

In other words: The current through the thryristor valve 10, 20 is metered. If a fault occurs and the current exceeds a certain level, the triggering of the thyristors is immediately switched over from the controlled and phase sequenced triggering to continuous triggering of all phases. This allows the fault current to flow without any reduction, but the continuous firing protects the thyristor 10, 20 as it does not have to block, i. e. the thyristor 10, 20 does not have to cope with any overvoltage.

In the fault condition, or overcurrent condition, it is not mandatory that also an overvoltage condition be present. Due to the increased junction temperature, the thyristor 10, 20 might not be able to block a certain voltage in this situation that could have been blocked without the increase of temperature.

In a conventional setting, the thyristor 10, 20 would be controlled such as to be in the blocking state, and thus overheat. For overheated thyristors the blocking voltage capability is highly reduced because of the increased junction temperature. In a conventional setting that does not employ the present technique, the thyristor 10, 20 is controlled to further block, which would lead to failure and/or destruction.

While the fault current flowing through the thyristor 10, 20 heats up the junction and reduces the blocking voltage capability of the semiconductor, by not having to block the voltage any more as the circuit breaker 70 disconnects the feed line 75 several tens to several hundreds of milliseconds later, the thyristor 10, 20 is protected. The fault, i. e. the overcurrent, is not prevented, but the blocking of the thyristor 10, 20 in the case of a fault condition is prevented, which would destroy the semiconductor when having to carry this fault current.

It is noted that according to the present technique, it is not a voltage but a high current that is monitored, and which is used by the thyristor control circuit 50 to determine the condition to issue the trigger instructions. The high current, or overcurrent, stems from a converter external fault.

By employing the present technique, for example, a series reactor for limiting a fault current can be dispensed with. Any such reactor would add cost and due to the electrical losses increase the operating cost. It would add a component which can fail. This component is not needed any more by employing the present technique.

Figure 2:
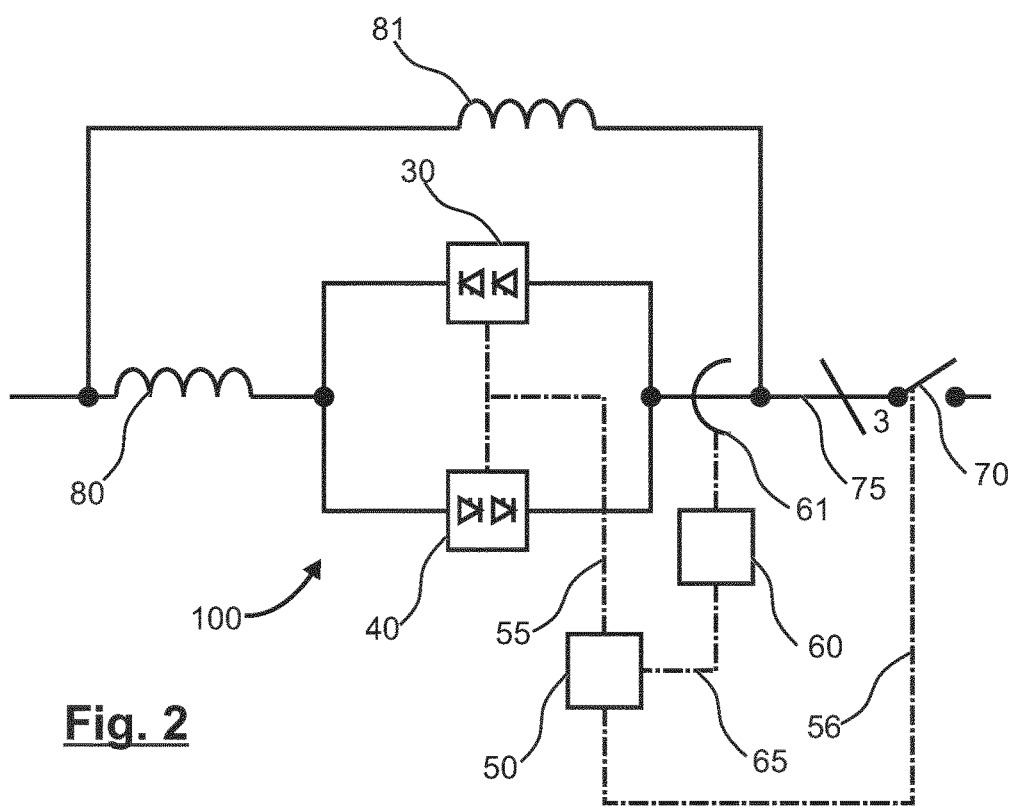
FIG. 2 schematically shows a thyristor circuit according to a further embodiment.

FIG. 2 schematically shows a thyristor circuit according to a further embodiment. In the embodiment of FIG. 2, a stack 30 of serially connected thyristors and an antiparallel-connected stack 40 of serially connected thyristors is provided in place of the single thyristors 10, 20. Each stack 30, 40 includes two or more thyristors that are connected in series, i. e. stacked. In a typical application, each stack 30, 40 includes at least 10 or at least 20 thyristors; for example, each stack 30, 40 includes 24 thyristors, but not limited to these numbers. As in the configuration shown in FIG. 1, in the embodiment of FIG. 2 three branches are configured as shown, and a three-phase circuit breaker 70 is provided to interrupt the feed line 75 upon receiving a circuit breaker signal.

Again, a parallel reactor 81 is provided per phase. Note that three phases are merely an example, and the present disclosure is not limited to a three-phase application, but is applicable to single-phase applications or multi-phase applications having a number of phases that is different from three.

The main way of operation of the other components including the thyristor control circuit 50 is mainly as described above in the embodiment of FIG. 1.

In the embodiment of FIG. 2 employing the stacks 30, 40, it is preferred that when the fault condition is determined to be present in one or more branches, all thyristors of a stack 30, 40 or all thyristors of each stack 30, 40 in the branch(es) in which the fault condition occurred are triggered, may be continuously triggered, into the conductive state.

In the embodiment of FIG. 2, configuration may be such that when the fault condition is determined to be present in one or more branches, all thyristors of each stack 30, 40 in all branches are triggered, may be continuously triggered, into the conductive state.

Figure 3:
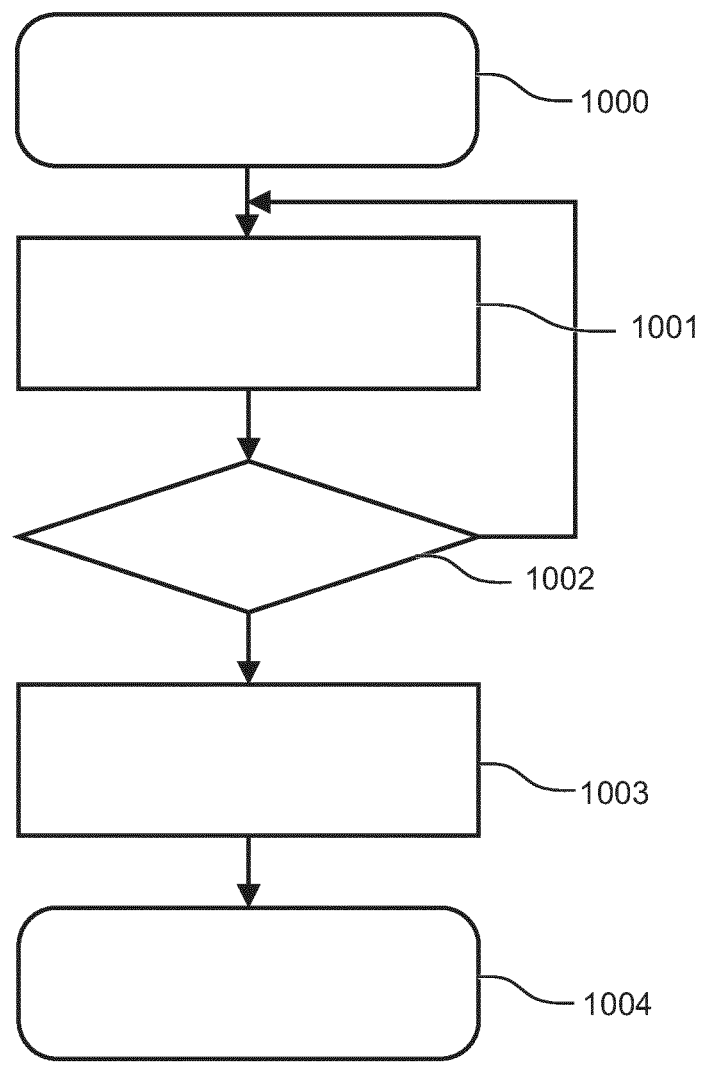
FIG. 3 shows a flow chart of a thyristor protection method according to embodiments described herein.

FIG. 3 shows a flow chart of a thyristor protection method according to embodiments described herein. The method is applicable, for example, to the example configuration shown in FIG. 1 or that shown in FIG. 2, but it can be applied to each suitable configuration having at least some of the constituent elements described above. The method is a thyristor protection method for protecting a thyristor 10, 20, possibly in a thyristor stack 30, 40, in at least one branch of a thyristor circuit 100.

In FIG. 3, the method is started in 1000. The processing proceeds to 1001 in which a current value representative of an electrical current flowing through the thyristor 10, 20 is detected. In 1002, it is determined whether the current value exceeds a predetermined current threshold. The current threshold is set in advance, and the current threshold is set taking into account the nominal operation range the thyristor, i. e. in the present case a maximum current that the thyristor is able to bear permanently without being destroyed.

If, in 1002, it is determined that the current value does not exceed the predetermined current threshold, the processing returns to 1001. If, in 1002, it is determined that the current value exceeds the predetermined current threshold, the processing continues in 1003. In 1003, the thyristor 10, 20 is triggered into a conductive state, may be continuously triggered into the conductive state. The processing proceeds to 1004, where the method is ended.

In FIG. 3, in 1003, as an example, triggering the thyristor into the conductive state typically includes continuously triggering the thyristor for at least 50 ms or at least 100 ms or at least 130 ms or at least 160 ms.

Along with triggering in 1003, the method typically provides issuing a triggering operation to open a circuit breaker, such as the three-phase circuit breaker 70 of FIGS. 1 and 2.

While the present disclosure illustrates specific embodiments and aspects in detail with reference to the drawings and the foregoing description, any such illustration and description are to be considered illustrative or example and not restrictive.

Other variations to the disclosed embodiments will be apparent to those skilled in the art. In the claims, the term "comprise" does not exclude other elements or steps, and the indefinite article "a"/"an" does not exclude a plurality. A single processor or controller or other unit may fulfil the function of several items of the description or the claims. For example, the current controller 60, 61 may be a single unit. For example, the current controller 60, 61, or parts thereof, may be integrated with the thyristor control circuit 50. The mere fact that certain measures are recited in mutually different dependent claims does not indicate that a combination of these measures cannot be used to advantage. Any reference signs in the claims should not be construed as limiting the scope.

The invention claimed is:

1. A thyristor circuit, comprising:
   at least one branch comprising at least one thyristor;
   a thyristor control circuit for selectively triggering the thyristor; and
   a current detector configured to detect a current value representative of an electrical current flowing through the thyristor and to input the detected current value into the thyristor control circuit, wherein the thyristor control circuit is configured to determine a fault condition in which the detected current value exceeds a predetermined current threshold based on a deteriorated blocking ability of the thyristor, and, dependent on the determination result, to trigger the thyristor into a conductive state.

2. The thyristor circuit according to claim 1, wherein the deteriorated blocking ability of the thyristor is dependent on a junction temperature of the thyristor.

3. The thyristor circuit according to claim 1, wherein triggering the thyristor into the conductive state comprises continuously triggering the thyristor into the conductive state.

4. The thyristor circuit according to claim 1, wherein the predetermined current threshold is set based on a junction temperature characteristic of the thyristor.

5. The thyristor circuit according to claim 1, further comprising a circuit breaker, wherein the thyristor control circuit is further configured, when it continuously triggers the thyristor, to control the circuit breaker to interrupt the electrical current.

6. The thyristor circuit according to claim 1, wherein triggering the thyristor into the conductive state includes continuously triggering the thyristor for at least 50 ms.

7. The thyristor circuit according to claim 1, wherein the thyristor circuit comprises a plurality of branches, each branch of the plurality of branches comprising at least one thyristor.

8. The thyristor circuit according to claim 7, wherein the thyristor control circuit is further configured to determine the fault condition when, in at least one of the plurality of branches, the detected current value exceeds the predetermined current threshold.

9. The thyristor circuit according to claim 7, wherein the thyristor control circuit is further configured to trigger the at least one thyristor of each branch into the conductive state dependent on the fault condition.

10. The thyristor circuit according to claim 1, wherein the at least one branch comprises a stack of thyristors.

11. The thyristor circuit according to claim 10, wherein the thyristor control circuit is further configured to trigger all thyristors of the stack in a respective branch into the conductive state dependent on the fault condition.

12. The thyristor circuit according to claim 10, wherein the at least one branch comprises a plurality of branches, each branch of the plurality of branches comprising a stack of thyristors, and wherein the thyristor control circuit is further configured to trigger all thyristors of each stack in all branches into the conductive state dependent on the fault condition.

13. The thyristor circuit according to claim 1, further comprising a network interface for connecting at least one of the thyristor control circuit and the current detector to a network, wherein the network interface is configured to transceive a digital signal between the thyristor control circuit and/or the current detector and the network, and wherein the digital signal includes an operational command.

14. A thyristor protection method for protecting a thyristor in at least one branch of a thyristor circuit, the method comprising:
    detecting a current value representative of an electrical current flowing through the thyristor;
    determining whether the current value exceeds a predetermined current threshold based on a blocking ability dependent on a junction temperature of the thyristor; and
    dependent on the determination result, triggering the thyristor into a conductive state.

15. The method of claim 14, wherein triggering the thyristor into the conductive state comprises continuously triggering the thyristor into the conductive state.

16. The method of claim 15, wherein the thyristor circuit further includes a circuit breaker, and wherein the method further comprises:
    controlling the circuit breaker to interrupt the electrical current while continuously triggering the thyristor into the conductive state.

17. The method of claim 15, wherein continuously triggering the thyristor into the conductive state further comprises:
    continuously triggering the thyristor for at least 50 ms.

18. A method of protecting a thyristor in at least one branch of a thyristor circuit, the method comprising:
    detecting a current value representative of an electrical current flowing through the thyristor;
    determining, based on a deteriorated blocking ability of the thyristor, whether the detected current value exceeds a predetermined current threshold; and
    triggering the thyristor into a conductive state in response to determining that the detected current value exceeds the predetermined current threshold.

19. The method of claim 18, wherein the deteriorated blocking ability of the thyristor is dependent on a junction temperature of the thyristor.

20. The method of claim 18, wherein the thyristor circuit further includes a circuit breaker, and wherein the method further comprises:
    controlling the circuit breaker to interrupt the electrical current while continuously triggering the thyristor into the conductive state.

* * * * *